United States Patent
Bendal (10) Patent No.: US 6,617,696 B1
(45) Date of Patent: Sep. 9, 2003

(54) SUPPORTING CONTROL GATE CONNECTION ON A PACKAGE USING ADDITIONAL BUMPS

(75) Inventor: R. Evan Bendal, Centerville, UT (US)

(73) Assignee: Fairchild Semiconductor Corporation, South Portland, ME (US)

(*) Notice: Subject to any disclaimer, the term of this patent is extended or adjusted under 35 U.S.C. 154(b) by 0 days.

(21) Appl. No.: 10/098,769

(22) Filed: Mar. 14, 2002

(51) Int. Cl.⁷ .............................................. H01L 23/48

(52) U.S. Cl. ..................... 257/780; 257/737; 257/738; 257/773

(58) Field of Search ................................ 257/780, 737, 257/738, 773, 502

(56) References Cited

U.S. PATENT DOCUMENTS 6,306,680 B1 * 10/2001 Fillion et al. ................ 438/106

* cited by examiner

Primary Examiner—Kamand Cuneo
Assistant Examiner—Luan Thai
(74) Attorney, Agent, or Firm—Thomas R. FitzGerald, Esq.

(57) ABSTRACT

A more robust mechanical connection is provided between a semiconductor device and the device package by adding one or more bumps to the gate connection without adding more gate pad area. A nonconductive layer covers the area around the gate pad and extends over the source area. One or more bumps fabricated on the nonconductive layer provide mechanical strength and support to the gate pad connection. The added bumps are not electrically connected to either the gate or the source. The package connections must be altered, both to fit the added bumps on the control gate, and to connect with fewer bumps on the source.

38 Claims, 16 Drawing Sheets

Fig. 1 (PRIOR ART)

Legend for Figures

SUPPORTING CONTROL GATE CONNECTION ON A PACKAGE USING ADDITIONAL BUMPS

FIELD OF INVENTION

This invention relates to semiconductor fabrication, and more specifically to power MOSFET contact fabrication.

DEFINITIONS

UBM: under-bump metal, the conductive metal used to connect a source or gate contact to an external circuit via a surface solder bump.

DISCUSSION OF PRIOR ART

Conductive bumps provide an interconnect between an active semiconductor device and a package which then is placed into an application. Discrete Field Effect Transistors (FETs) usually have at least 3 connections: (1) a control gate; (2) a drain; and (3) a source. The drain is usually the back side of a die and the entire back side of the die is mechanically and electrically connected to the package. The source is usually on the front side of the die and has several bumps, which provide mechanical and electrical contact to the package. The control gate traditionally has only a single bump connected to the contact of the package on the front side of the die. The use of a single bump for the gate connection creates a significant probability of gate connection failure due to mechanical stress. This contrasts with a lower probability of such failure for a source connection, which has multiple bumps that continue to operate if any one of them fails. To put more bumps on a gate pad would reduce the likelihood of gate connection failure, but it would require a larger gate pad and therefore more area for the total die, increasing the cost of manufacturing the device.

Figure 1:
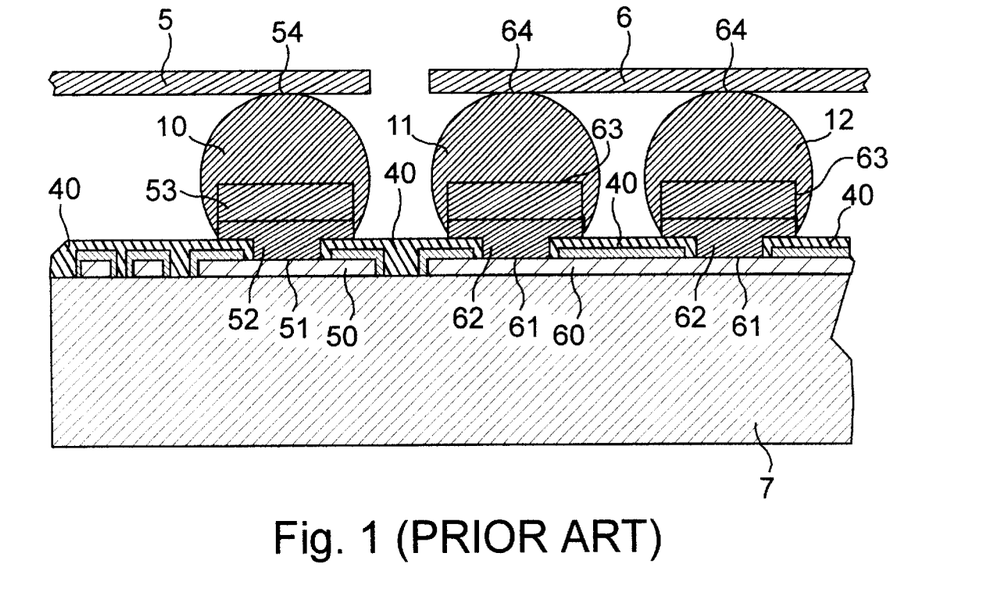
FIG. 1 shows a cross-sectional view of a device manufactured according to the prior art.

See FIG. 1, showing a cross section of the gate area of a prior art device. Gate bump 10 is fabricated directly above gate metallization 50, gate contact 51, and under bump metal 52 and 53, to make an external contact between gate metallization 50 of wafer 7 and package control gate connection 5, via connection point 54. Source bumps 11, 12 are fabricated directly above source metallization 60, source contact 61, and under bump metal 62 and 63, to make an external contact between source metallization 60 of wafer 7 and package source connection 6, via connection points 64. An insulating layer 40 provides electrical isolation between gate and source circuitry. A second insulating layer 90 provides added isolation and external protection.

Figure 2:
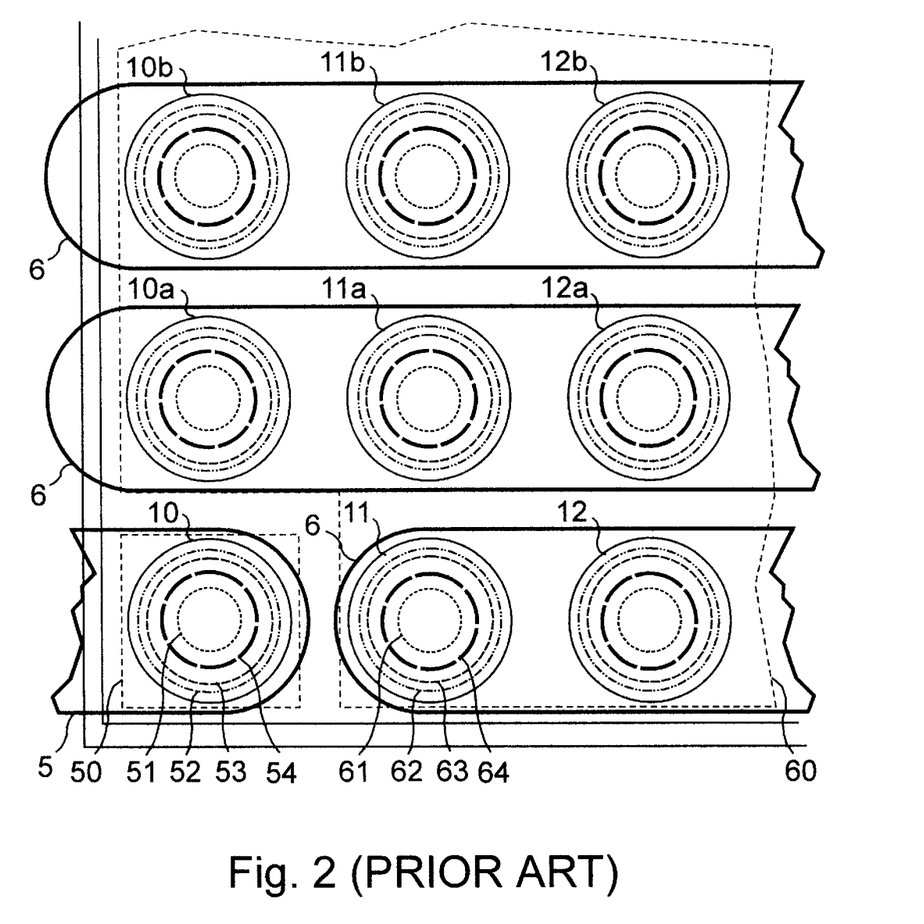
FIG. 2 shows a plan view of the prior art approach to gate bump connection design.

FIG. 2 shows the prior art approach in plan view. To simplify FIG. 2 without omitting essentials of the invention, the SiO or SiN passivating layers over gate and source metallizations are not shown in the figure. The single package control gate connection 5 connects at contact point 54 over bump 10, with no additional mechanical support for the gate connection.

The single gate bump 10 represents a single point of failure for the entire device. Gate bump 10 is the sole point of contact for package control gate connection 5, at connection point 54. If mechanical stress causes delamination of under bump metal 52 or 53, the gate connection will fail. Some means of reducing the mechanical stresses on the gate bump connection is needed.

SUMMARY

The invention provides a more robust mechanical connection between a semiconductor device and the device package by adding one or more bumps to the gate connection without adding more gate pad area. The invention first provides a nonconductive layer covering the area around the gate pad and extending over the source area. The invention adds one or more bumps on the nonconductive layer to provide mechanical strength and support to the gate pad connection. The added bumps are not electrically connected to either the gate or the source. The package connections must be altered, both to fit the added bumps on the control gate, and to connect with fewer bumps on the source.

DESCRIPTION OF DRAWINGS

For convenience, a legend for the figures is shown on the drawing sheet with FIG. 1. To simplify FIGS. 2, 4, and 5, the SiO or SiN passivating layers over gate and source metallizations are not shown in these figures.

DETAILED DESCRIPTION OF INVENTION

This invention improves the strength and durability of the mechanical connection between a semiconductor device and the device package by adding contact bumps to the gate connection without adding more gate pad area to the device. This is accomplished by providing a nonconductive layer covering the area around the gate pad and extending the nonconductive layer over the source area. The invention adds one or more bumps on this nonconductive layer to provide mechanical strength to the gate pad connection. The added bumps are not electrically connected to the gate or the source.

Figure 3A:
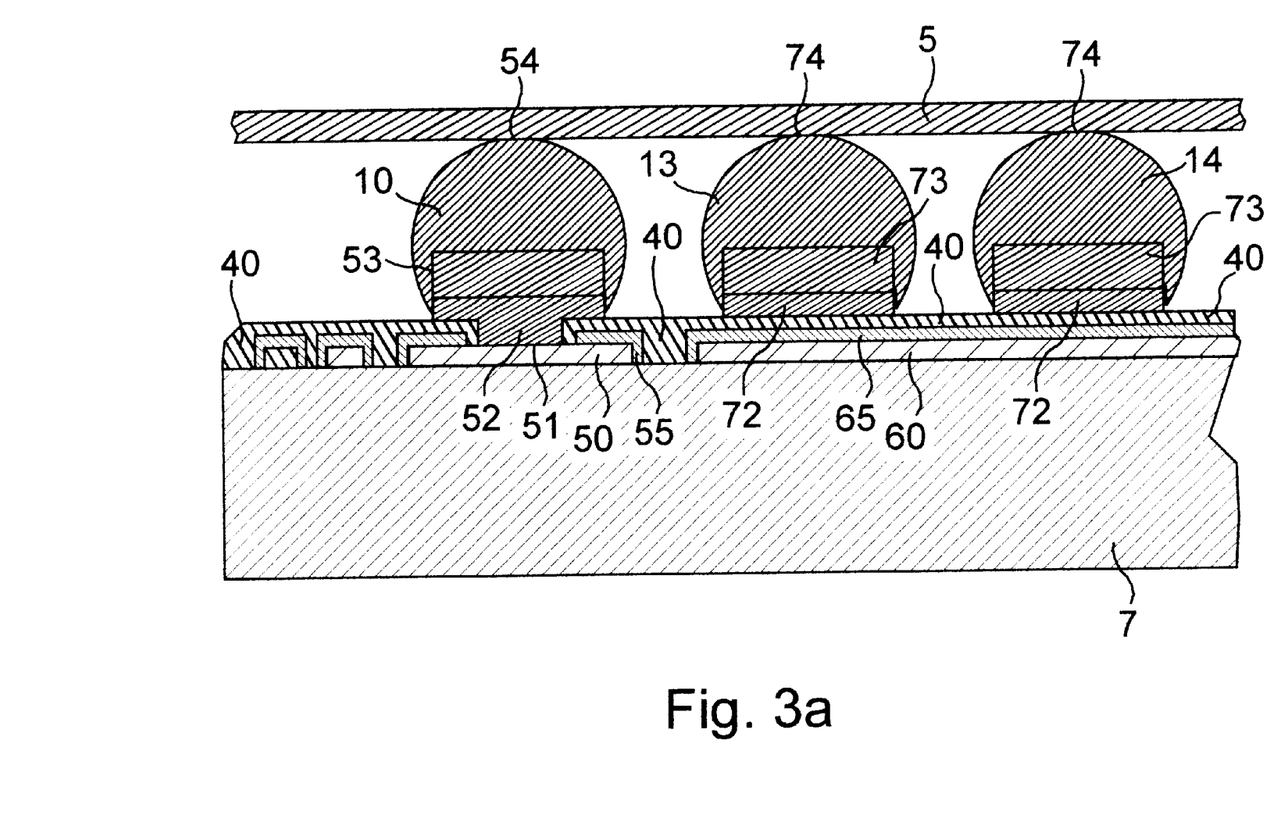
FIG. 3a shows a cross-sectional view of a device manufactured according to a first embodiment of the invention.

See FIG. 3a, showing a cross section of the gate contact area. Gate bump 10 is fabricated directly above gate metallization 50, gate contact 51, and under bump metal 52, 53, to make an external contact between gate metallization 50 of wafer 7 and package control gate connection 5, via gate connection point 54. In contrast to the prior art device, however, the invention fabricates one or more unconnected support bumps 13, 14, with under bump metal 72, 73 over insulating layer 40, source passivation layer 65, and source metallization 60. Under bump metal 72 anchors to insulating layer 40. Insulating layer 40 and source passivation layer 65 isolate support bumps 13, 14 and under bump metal 72, 73 from source metallization 60 and the source circuitry. Support bumps 13, 14 have no electrical connection either to gate metallization 50 or to source metallization 60. Support bumps 13, 14 provide mechanical support for package control gate connection 5 at contact points 74, partially relieving gate connection point 54 of excess pressure during package assembly and later use. Insulating layer 40 provides electrical isolation between gate and source circuitry.

Figure 3B:
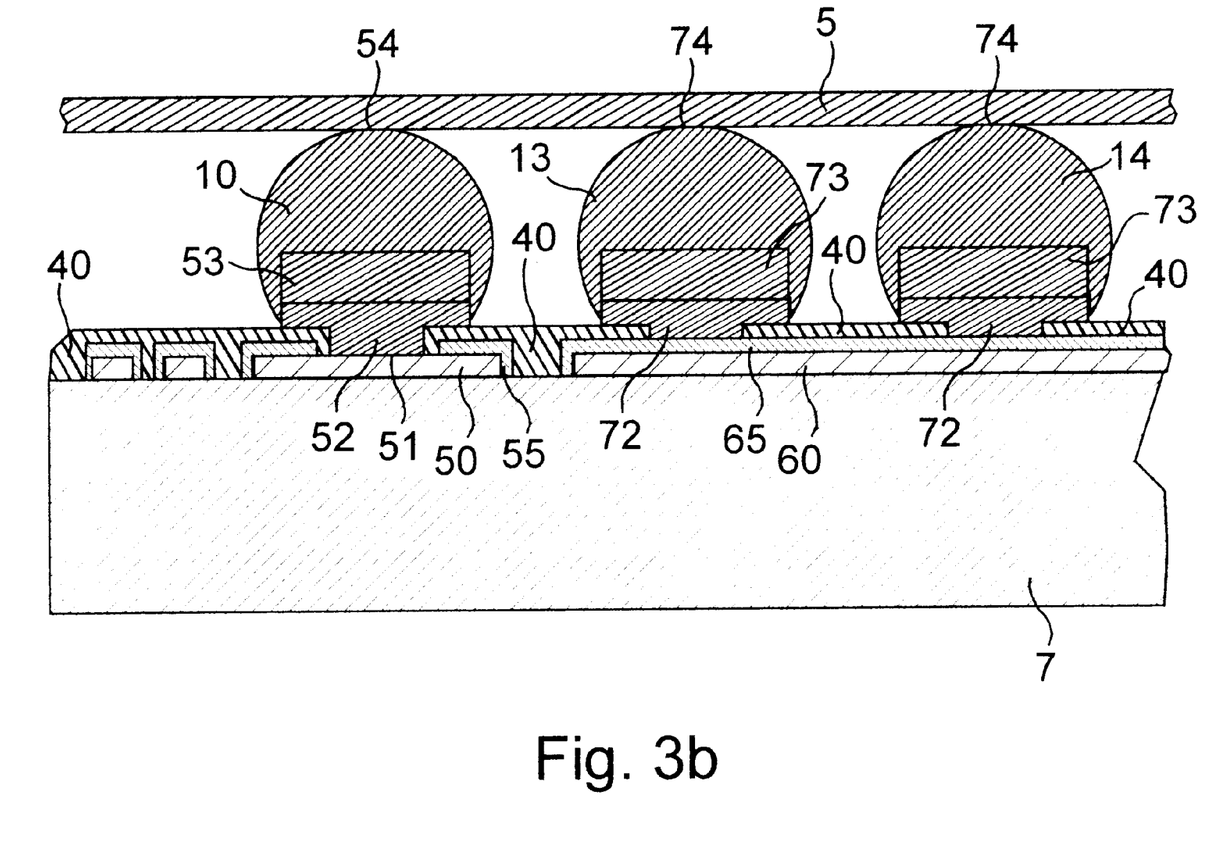
FIG. 3b shows a cross-sectional view of a device manufactured according to a second embodiment of the invention.

In a second embodiment, shown in FIG. 3b, insulating layer 40 is fabricated via its mask layout with openings through which under bump metal 72 is partially or completely anchored to source passivation layer 65. Since bumps adhere well either to an insulating layer such as BCB or a passivating layer such as oxinitride, the choice of support bump embodiments may be based on the results of bump shear tests.

Figure 4:
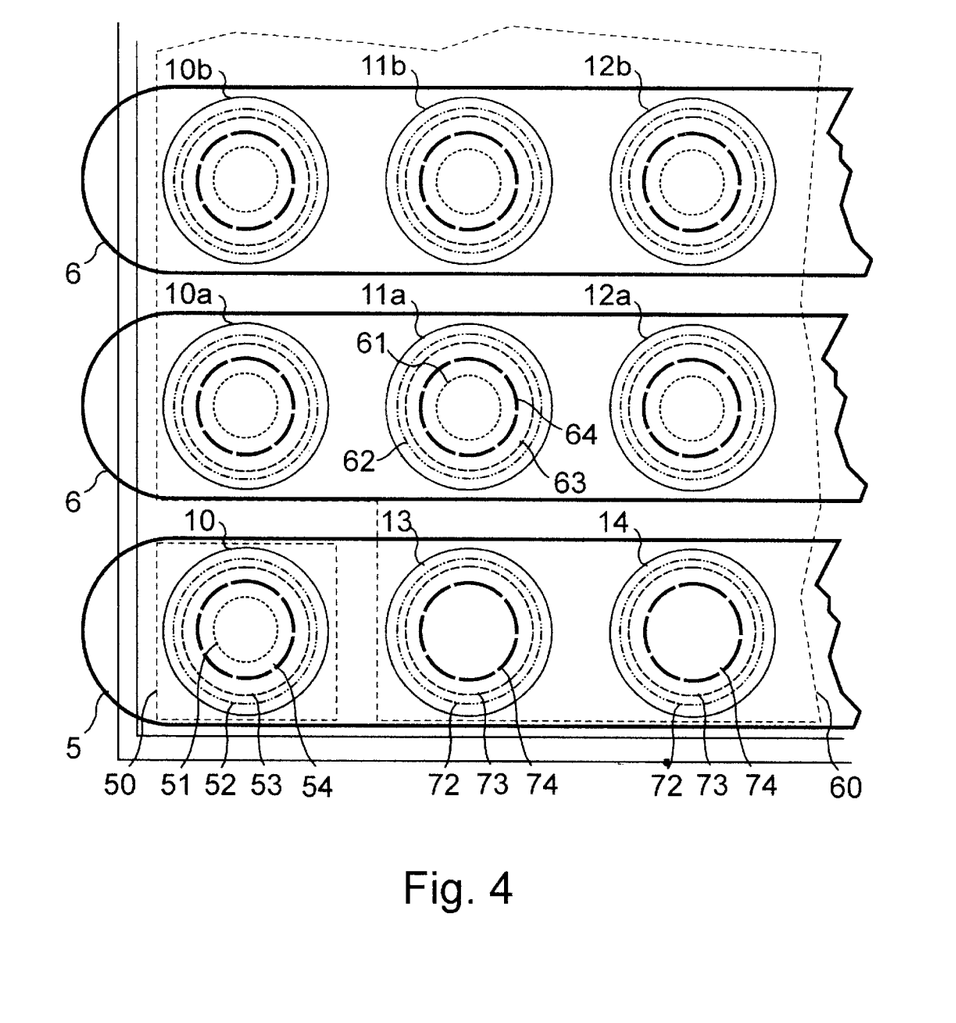
FIG. 4 shows a plan view of the invention's approach to supporting gate bump connection design.
Figure 5:
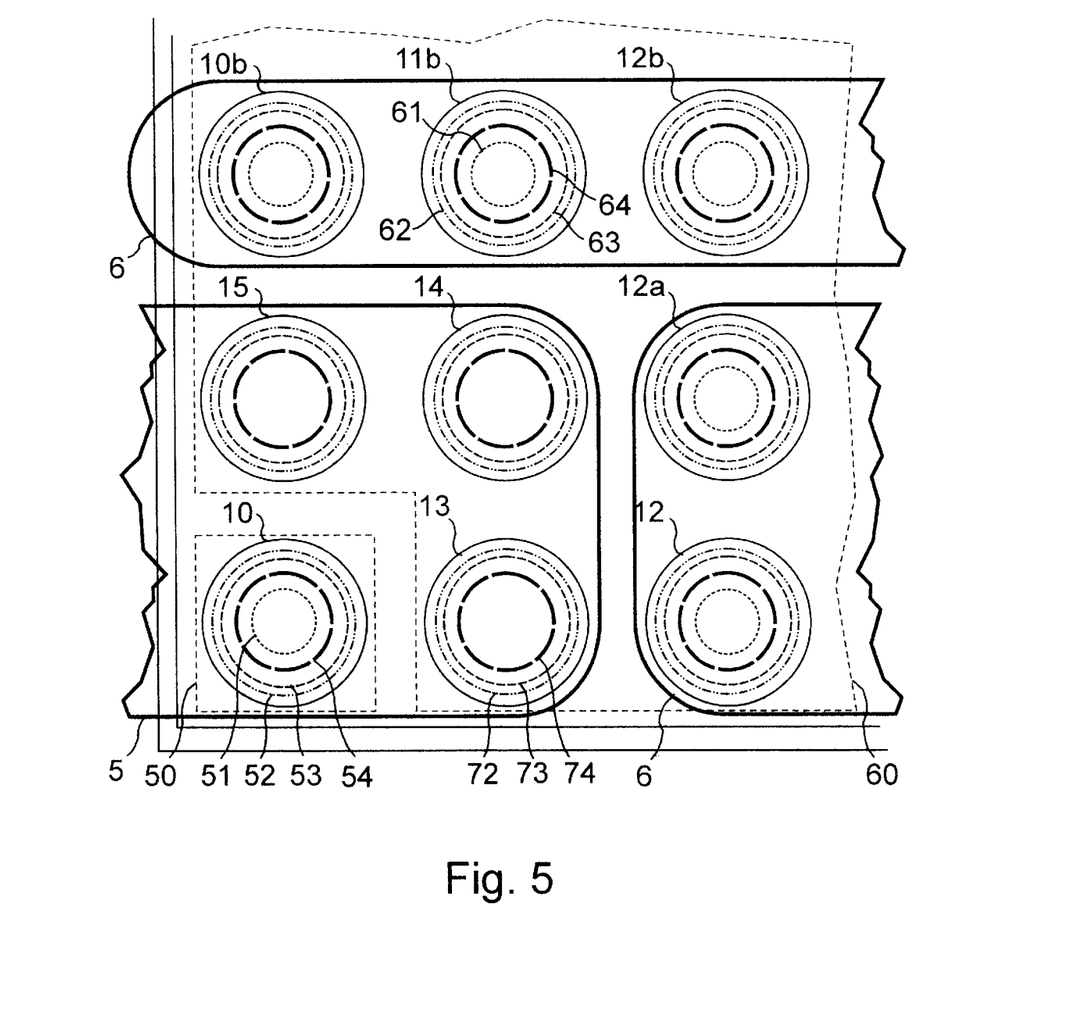
FIG. 5 shows a plan view of an alternate embodiment of the invention's approach to supporting gate bump connection design.

FIG. 4 shows the invention's approach in plan view. To simplify FIG. 4 without omitting essentials of the invention, the SiO or SiN passivating layers over gate and source metallizations are not shown. Package control gate connection 5 connects at contact point 54 to bump 10, but here support bumps 13, 14 supply mechanical support for the control gate connection at contact points 74. Support bumps 13, 14 do not make electrical contact with either the gate or the source circuitry. In an alternate embodiment, shown in FIG. 5, the invention's approach uses a set of support bumps 13, 14, 15 closely surrounding gate bump 10 to provide mechanical support at contact points 74 for the package control gate connection. Support bumps 13, 14, 15 make no electrical contact with either the gate or the source circuitry.

Figure 6:
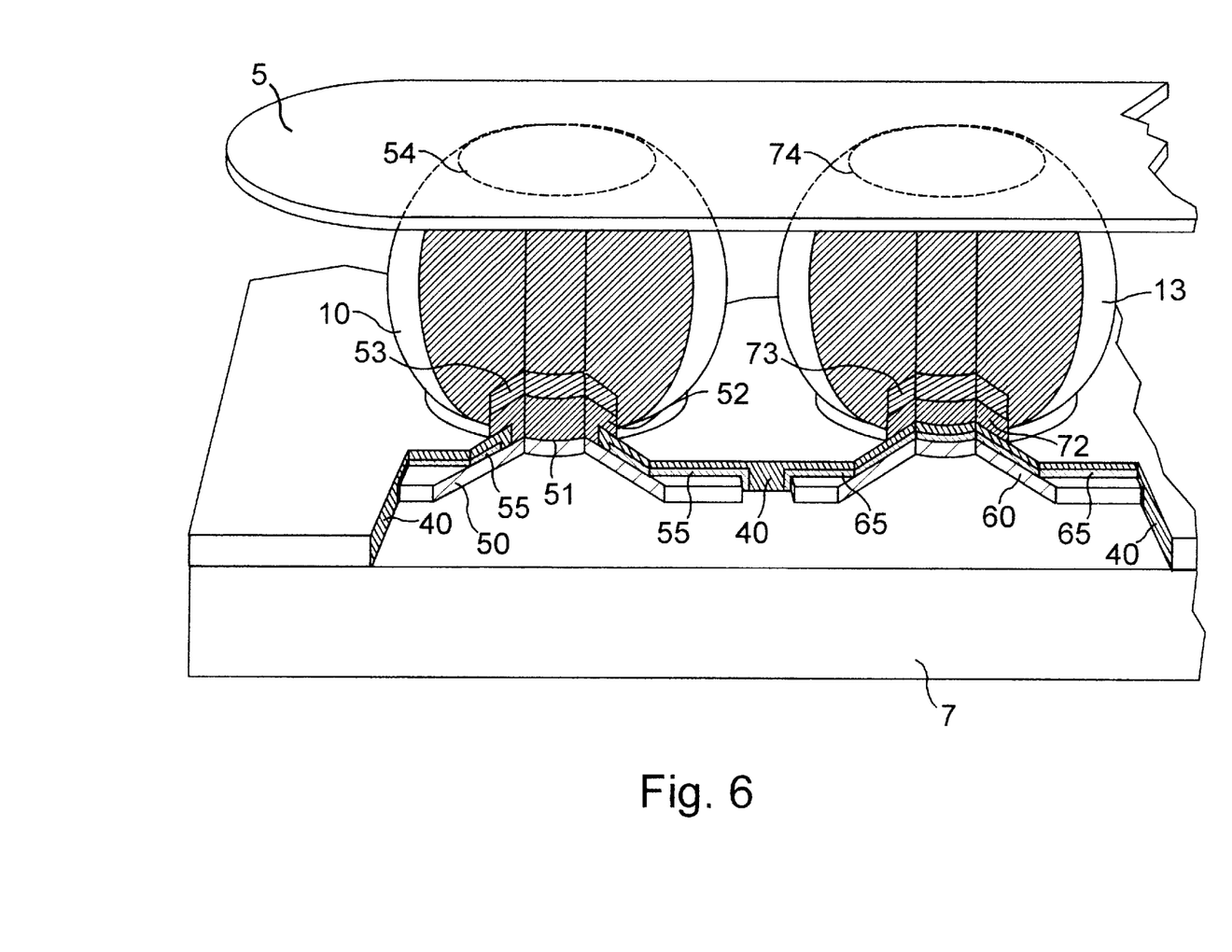
FIG. 6 shows a cutaway view of the invention's approach to supporting gate bump connection design.

FIG. 6 shows in cutaway detail the difference between the layers underlying gate bump 10 and a neighboring support bump 13 used for mechanical support for package control gate connection 5. Bump 10's electrical contact is made through metallization layer 50, gate contact 51, under bump metal 52, 53, and package control gate connection contact point 54. Support bump 13 makes no electrical contact. Insulating layer 40 isolates support bump 13 and under bump metal 72, 73 from source metallization 60. Through contact point 74, support bump 13 provides mechanical support for package control gate connection 5.

Figure 7:
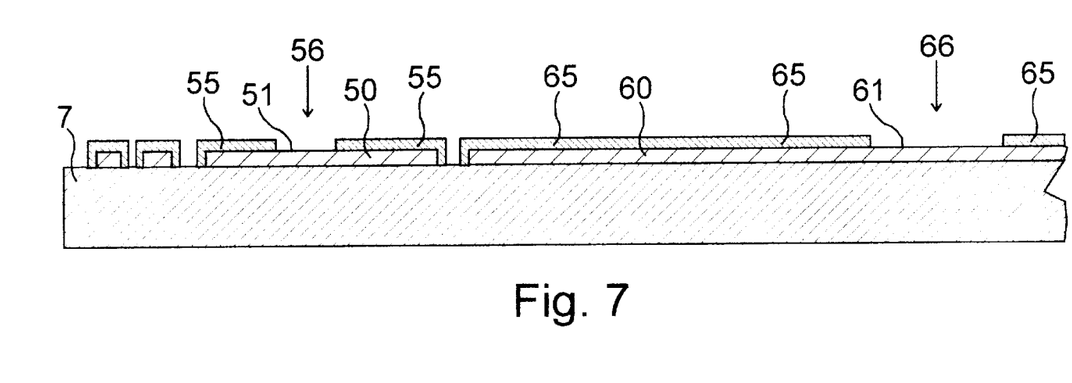
FIGS. 7 and 8 show the initial fabrication steps for the invention.

The invention's fabrication process is as follows. See FIG. 7. Gate contact Al metallization 50 and source contact Al metallization 60 are layered on semiconductor wafer 7. FIG. 7 shows a silicon oxide or silicon nitride passivation 55 layered over gate metal to provide physical protection, with an opening 56 fabricated in passivation layer 55 to expose gate contact 51. Silicon oxide or silicon nitride passivation layer 65 is layered over source metallization 60 to provide protection for the metal layer. Source contacts 61 are exposed by openings 66 in source passivation layer 65.

Figure 8:
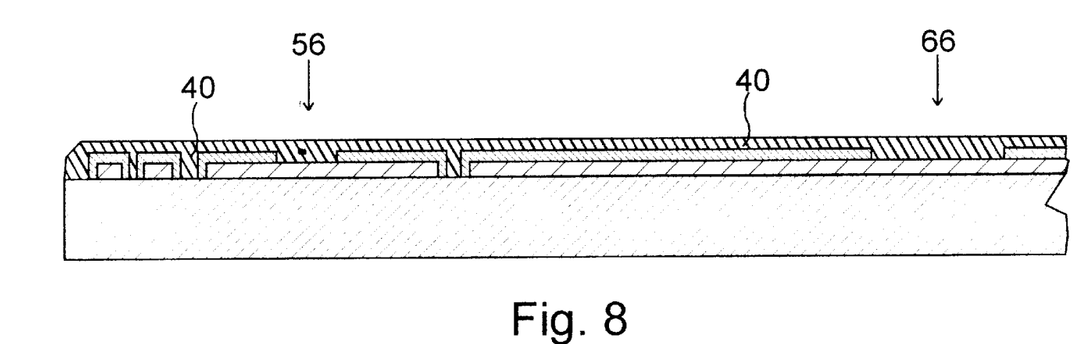
Figure 9A:
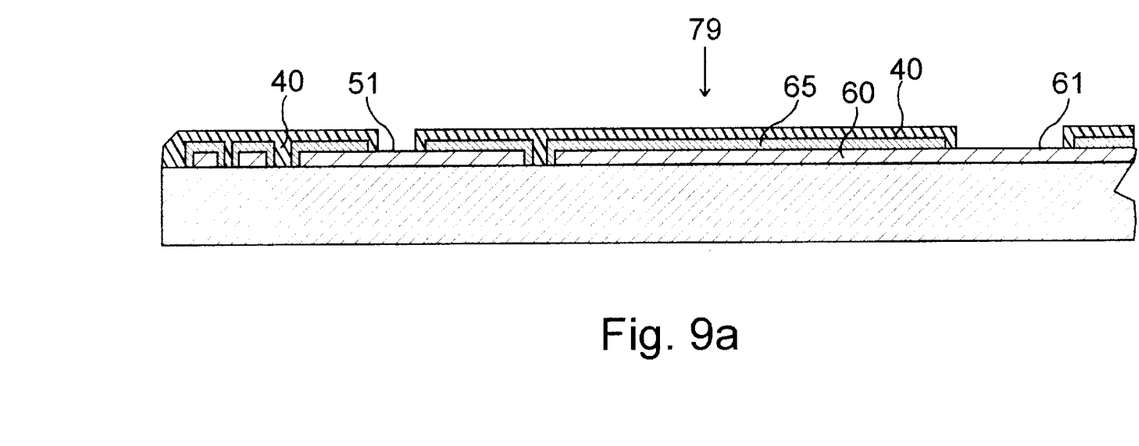
FIGS. 9a, 10a, 11a, 12a, 13a, 14a, 15a, and 16a show further fabrication steps for a first embodiment of the invention.
Figure 9B:
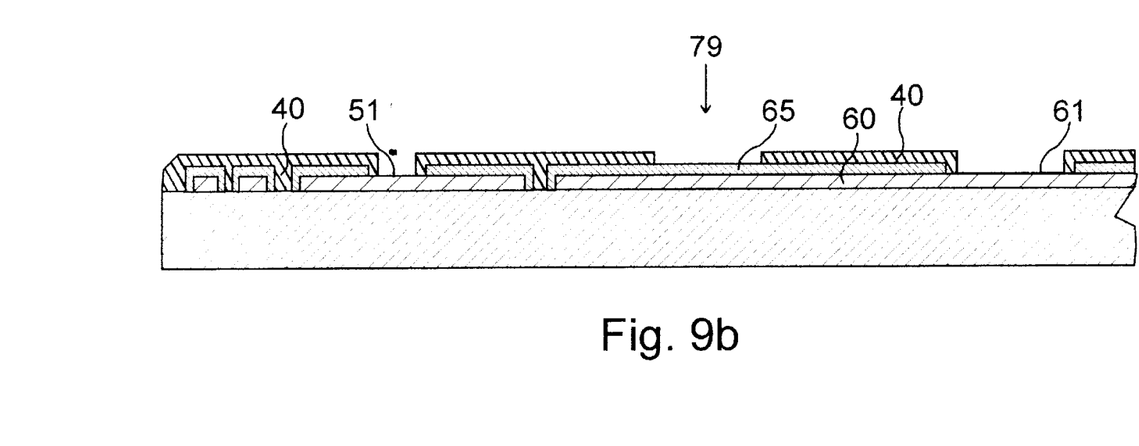
FIGS. 9b, 10b, 11b, 12b, 13b, 14b, 15b, and 16b show further fabrication steps for a second embodiment of the invention.

A BCB layer 40 is coated and baked on the wafer as shown in FIG. 8. BCB layer 40 is exposed and developed to define the exposed gate contact 51 and exposed source contacts 61 as shown in FIGS. 9a and 9b. See FIG. 9a. In a first embodiment, in area 79, BCB layer 40 is left intact with source passivation layer 65 to act as support and insulation for an eventual gate support bump. In FIG. 9b, showing a second embodiment, BCB layer 40 is removed to expose gate contact 51 and source contacts 61, and in area 79 to expose only source passivation layer 65. In the second embodiment, source passivation layer 65 acts directly as anchor and insulation for an eventual gate support bump.

In the remaining figures showing the fabrication process, FIGS. 9a, 10a, 11a, 12a, 13a, 14a, 15a, and 16a show the process for the first embodiment, and FIGS. 9b, 10b, 11b, 12b, 13b, 14b, 15b, and 16b show the process for the second embodiment.

Figure 10A:
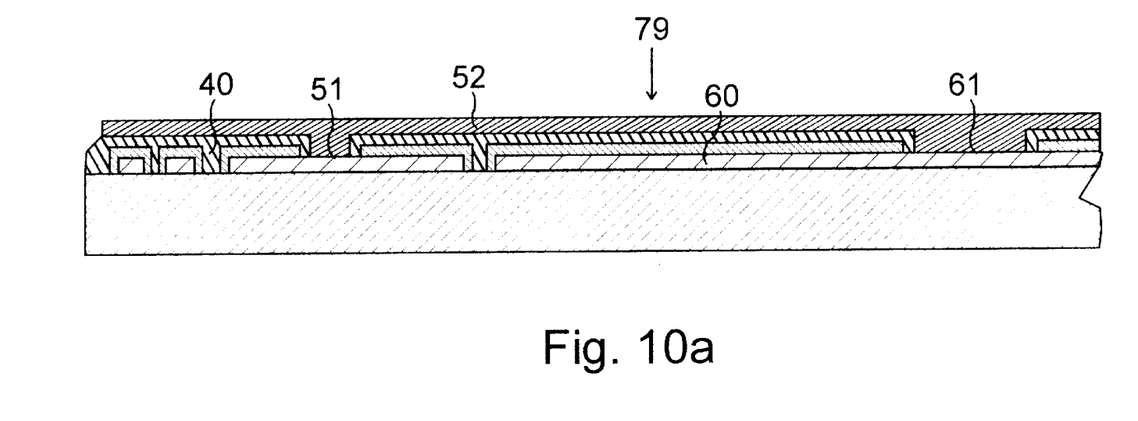
Figure 10B:
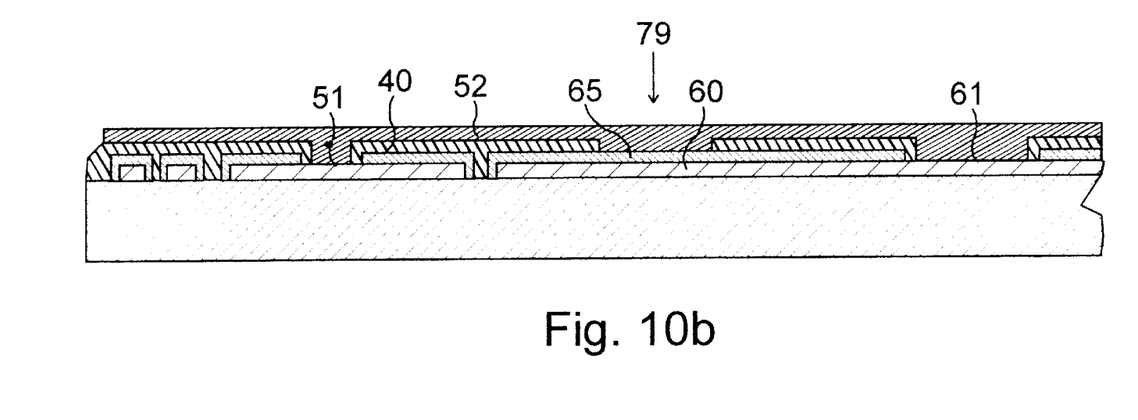
Figure 11A:
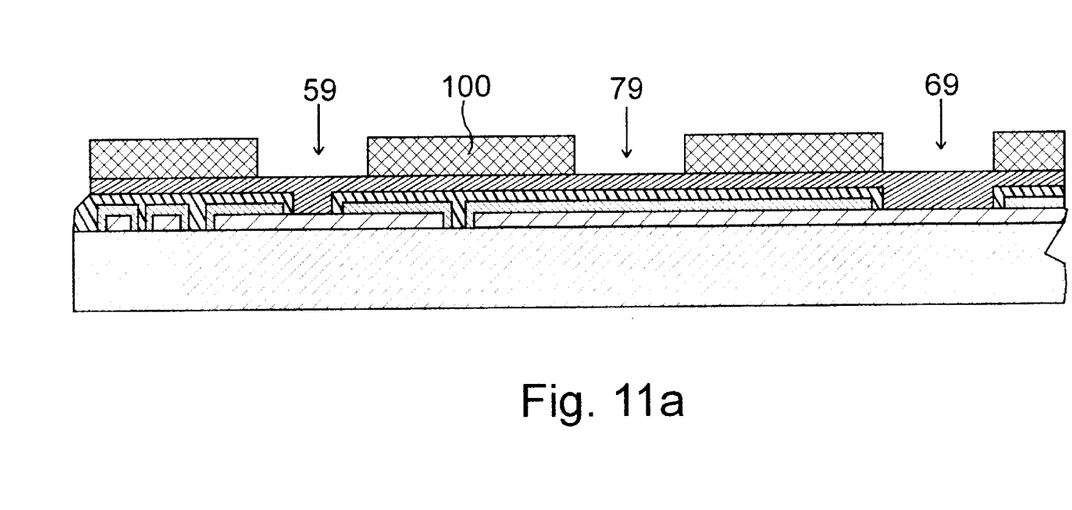
Figure 11B:
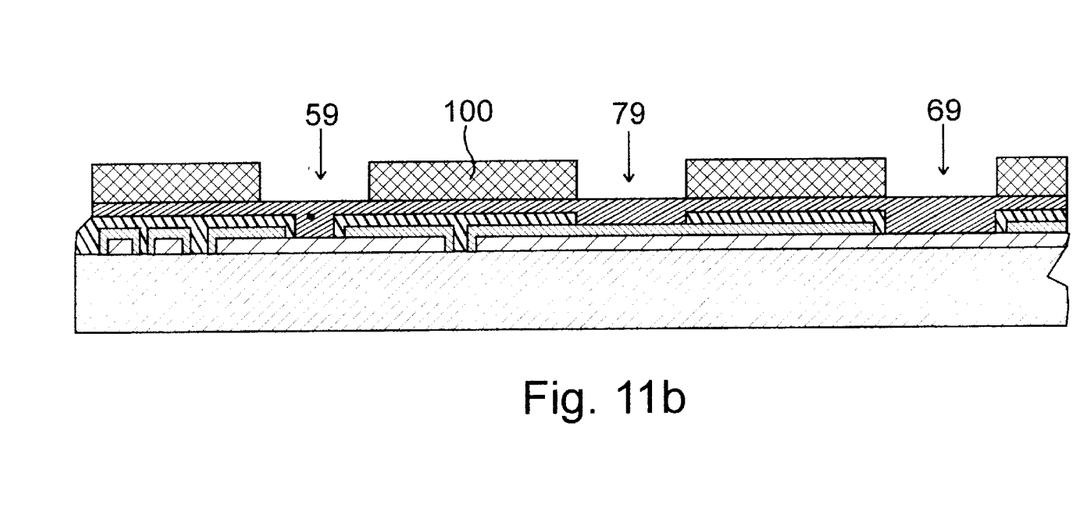
Figure 12A:
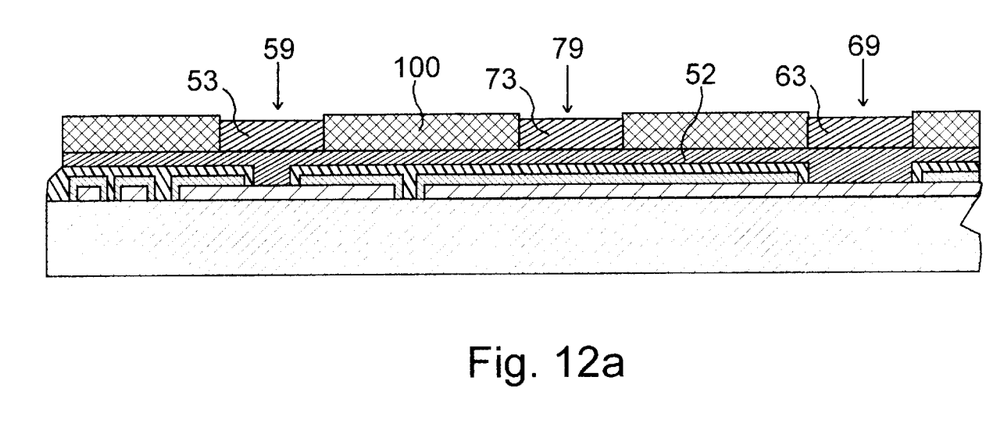
Figure 12B:
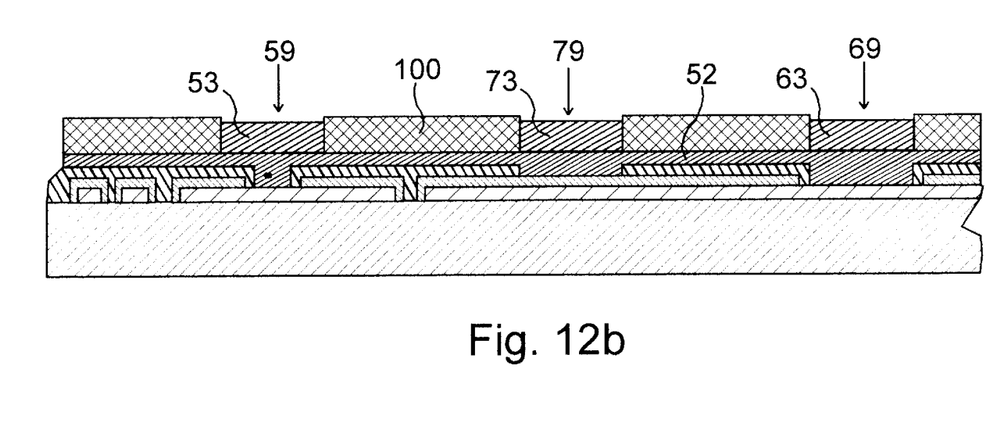
Figure 13A:
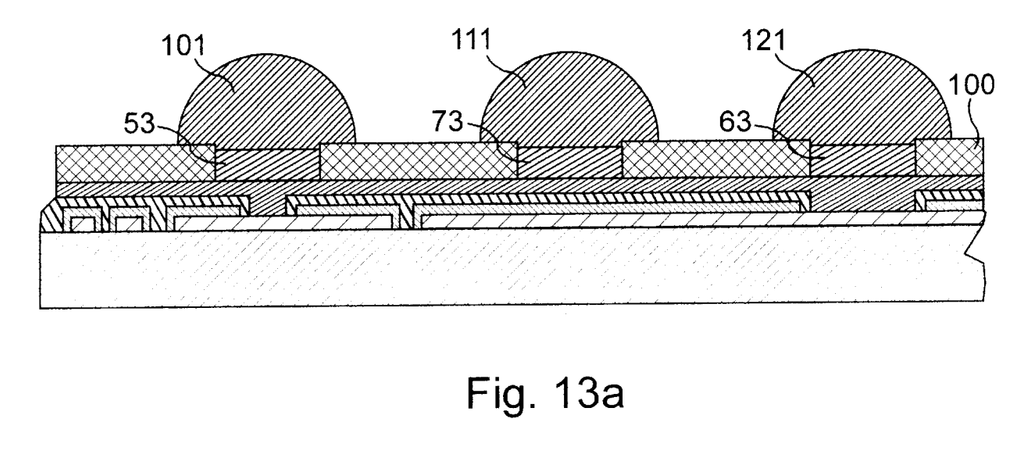
Figure 13B:
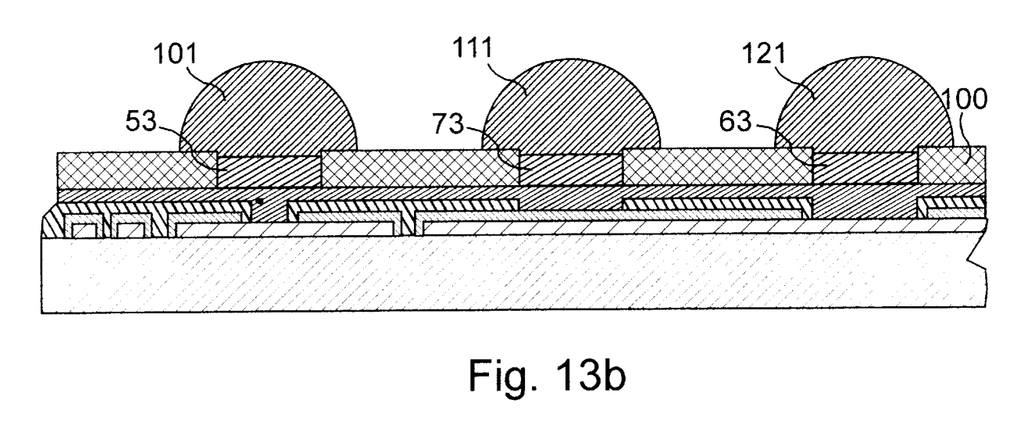
Figure 14A:
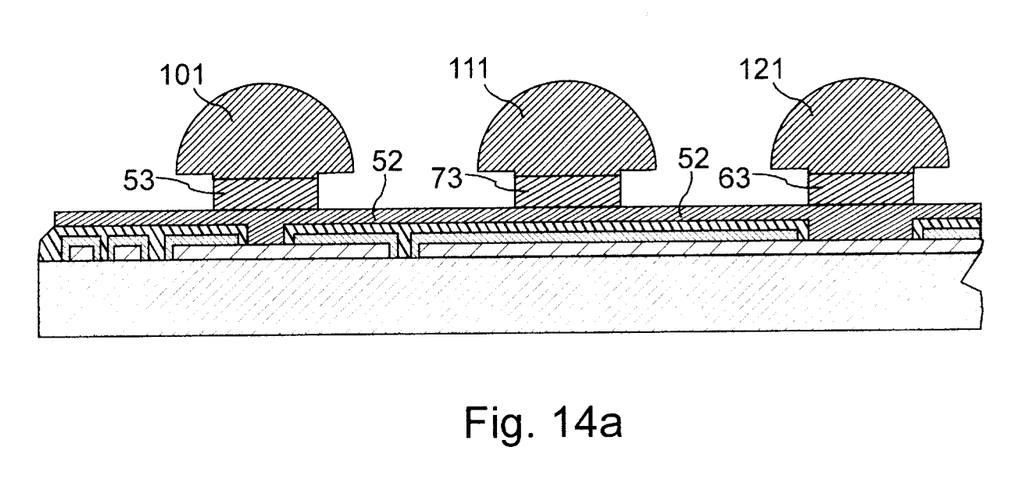
Figure 14B:
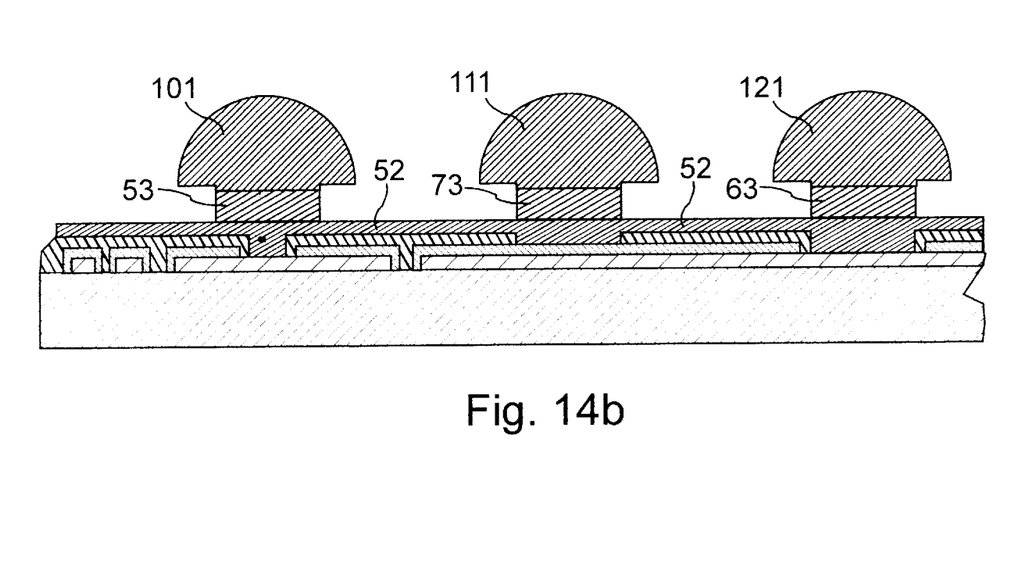
Figure 15A:
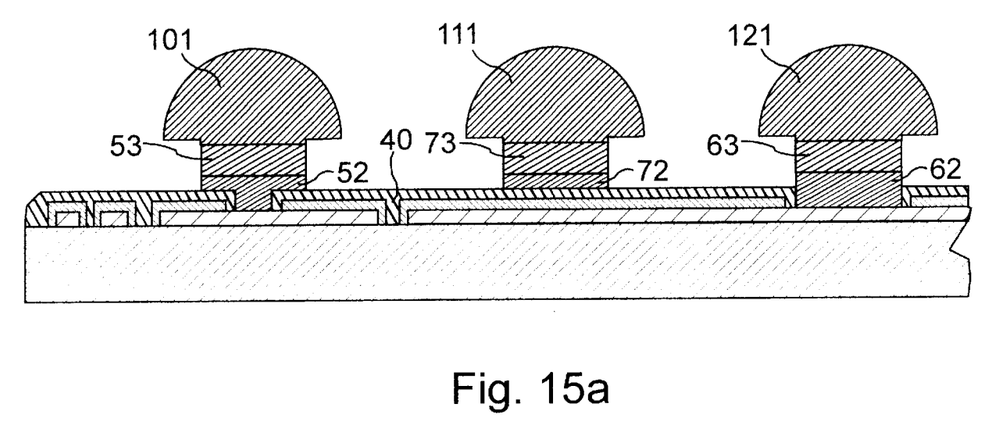
Figure 15B:
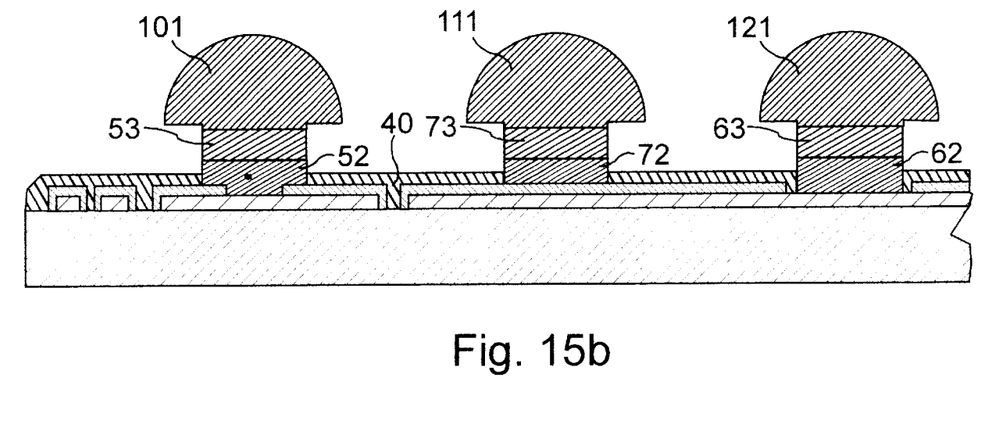
Figure 16A:
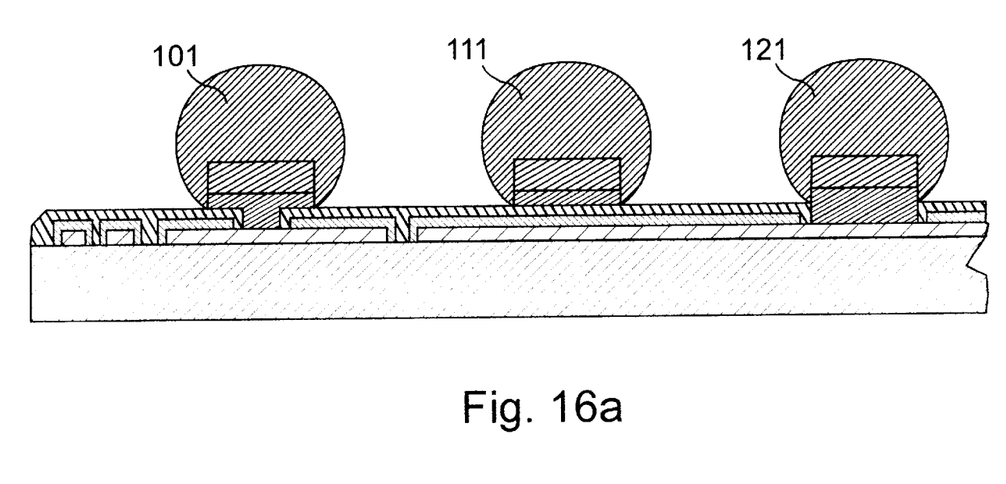
Figure 16B:
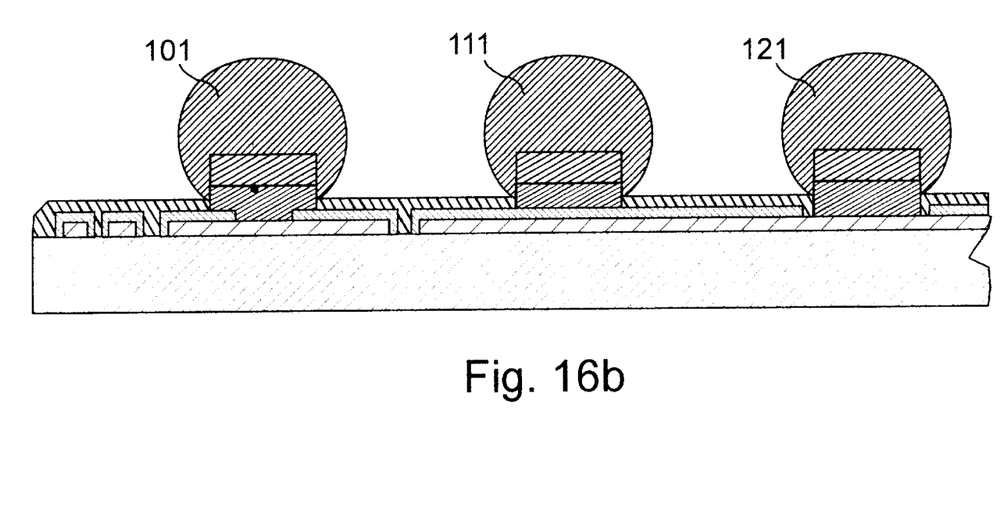

See FIG. 10a. An under bump metal 52, such as Ti followed by Cu, is then sputtered onto BCB layer 40, gate contact 51 and source contacts 61. As shown in FIG. 10b, the second embodiment's opening in BCB layer 40 in area 79 brings under bump metal 52 into contact with source passivation layer 65. A thick photoresist coating 100 is added, UV-exposed and developed to expose UBM areas 59, 69, 79 (FIGS. 11a and 11b) where Cu 53 is to be plated onto exposed UBM 52. Cu 53, 63, 73 is plated onto exposed under bump metal 52, as shown in FIGS. 12a and 12b, to ensure retention of bulk copper interconnect after the soldering process, since part of the copper is consumed with the formation of intermetallics with adjacent metal layers.

Gate solder bump 101, gate support solder bumps 111, and source solder bumps 121 are plated onto Cu 53, 73, and 63 respectively (FIGS. 13a and 13b), with photoresist 100 supporting the edges of the bumps around Cu 53, 73, and 63. Photoresist 100 is stripped (FIGS. 14a and 14b) to expose UBM 52. UBM 52 is etched to define final UBM 52, 72, 62 (FIGS. 15a and 15b) and plated solder bumps 101, 111, 121 are reflowed (FIGS. 16a and 16b) to form final solder bumps.

For all embodiments, the device package connections must be altered to accommodate the extra bumps on the control gate and the smaller number of bumps used for the source.

Conclusion, Ramifications, and Scope of Invention

From the above descriptions, figures and narratives, the invention's advantages in providing mechanically reliable, durable, and economical MOSFET gate contacts should be clear.

Although the description, operation and illustrative material above contain many specificities, these specificities should not be construed as limiting the scope of the invention but as merely providing illustrations and examples of some of the preferred embodiments of this invention.

Thus the scope of the invention should be determined by the appended claims and their legal equivalents, rather than by the examples given above.

What is claimed is:

1. A semiconductor apparatus having a robust and reliable MOSFET gate external connection, comprising:
    a semiconductor body having a first surface and a second surface;
    a source contact area on the first surface of the semiconductor body;
    a drain contact area on the second surface of the semiconductor body;
    a gate contact area on the first surface of the semiconductor body and separate from the source contact area;
    a source contact metallization layer overlying the source contact area;
    a gate contact metallization layer overlying the gate contact area;
    a source contact passivation layer overlying the source contact metallization layer and having one or more source contact openings each exposing a portion of the surface of the source contact metallization layer;
    a gate contact passivation layer overlying the gate contact metallization layer and having a first gate contact opening exposing a portion of the surface of the gate contact metallization layer;
    a first insulating layer overlying the gate contact passivation layer and the source contact passivation layer, having a second gate contact opening exposing the first gate contact opening, and completely overlying one or more source contact areas proximate to the gate contact area;
    a first conducting metal layer partially overlying the first insulating layer, connected to the gate contact metallization layer via the second gate contact opening;

a metal plating layer overlying and in contact with the first conducting metal layer;

a gate contact solder bump overlying the metal plating layer;

one or more anchoring metal layers overlying the source contact passivation layer, electrically insulated from both the gate contact metallization layer and the source contact metallization layer; and one or more gate support solder bumps each overlying an anchoring metal layer.

2. The apparatus of claim 1 wherein the semiconductor body comprises wafer silicon.

3. The apparatus of claim 1 wherein the source contact metallization layer comprises aluminum.

4. The apparatus of claim 1 wherein the gate contact metallization layer comprises aluminum.

5. The apparatus of claim 1 wherein the source contact passivation layer comprises silicon dioxide.

6. The apparatus of claim 1 wherein the source contact passivation layer comprises silicon nitride.

7. The apparatus of claim 1 wherein the gate contact passivation layer comprises silicon dioxide.

8. The apparatus of claim 1 wherein the gate contact passivation layer comprises silicon nitride.

9. The apparatus of claim 1 wherein the first insulating layer comprises benzocyclobutene.

10. The apparatus of claim 1 wherein the first conducting metal layer comprises titanium copper.

11. The apparatus of claim 1 wherein the metal plating layer comprises copper.

12. The apparatus of claim 1 wherein the metal plating layer comprises nickel.

13. The apparatus of claim 1 wherein a plurality of the one or more anchoring metal layers comprise copper.

14. The apparatus of claim 1 wherein a plurality of the one or more anchoring metal layers comprise titanium copper.

15. The apparatus of claim 1 wherein a plurality of the one or more anchoring metal layers comprise nickel.

16. The apparatus of claim 1 wherein the one or more anchoring metal layers overlying the source contact passivation layer also overlie the first insulating layer.

17. A semiconductor apparatus having a robust and reliable MOSFET gate external connection, comprising:

a semiconductor body having a first surface and a second surface;

a source contact area on the first surface of the semiconductor body;

a drain contact area on the second surface of the semiconductor body;

a gate contact area on the first surface of the semiconductor body and separate from the source contact area;

a source contact conducting extension means overlying the source contact area;

a gate contact conducting extension means overlying the gate contact area;

a source contact protection means overlying the source contact conducting extension means and having one or more source contact openings exposing a portion of the surface of the source contact conducting extension means;

a gate contact protection means overlying the gate contact conducting extension means and having a first gate contact opening exposing a portion of the surface of the gate contact conducting extension means;

a first insulating means overlying the gate contact protection means and the source contact protection means and having a second gate contact opening exposing the first gate contact opening, and completely overlying one or more source contact areas proximate to the gate contact area;

a first conducting means partially overlying the first insulating means, connected to the gate contact conducting extension means via the second gate contact opening in the first insulating means;

a second conducting means overlying and in contact with the first conducting means;

a conducting external gate connection means overlying and in contact with the exposed portion of the second conducting means;

one or more anchoring means overlying the source contact protection means and overlying the first insulating means, electrically insulated from both the gate contact conduction extension means and the source contact conduction extension means; and one or more gate support means overlying each anchoring means.

18. The apparatus of claim 17 wherein the semiconductor body comprises wafer silicon.

19. The apparatus of claim 17 wherein the source contact conducting extension means comprises a metallization layer.

20. The apparatus of claim 19 wherein the metallization layer comprises aluminum.

21. The apparatus of claim 17 wherein the gate contact conducting extension means comprises a metallization layer.

22. The apparatus of claim 21 wherein the metallization layer comprises aluminum.

23. The apparatus of claim 17 wherein the source contact protection means comprises a passivation layer.

24. The apparatus of claim 23 wherein the passivation layer comprises silicon dioxide.

25. The apparatus of claim 23 wherein the passivation layer comprises silicon nitride.

26. The apparatus of claim 17 wherein the gate contact protection means comprises a passivation layer.

27. The apparatus of claim 26 wherein the passivation layer comprises silicon dioxide.

28. The apparatus of claim 26 wherein the passivation layer comprises silicon nitride.

29. The apparatus of claim 17 wherein the first insulating means comprises benzocyclobutene.

30. The apparatus of claim 17 wherein the first conducting means comprises titanium copper.

31. The apparatus of claim 17 wherein the second conducting means comprises a metal plating layer.

32. The apparatus of claim 31 wherein the metal plating layer comprises nickel.

33. The apparatus of claim 31 wherein the metal plating layer comprises copper.

34. The apparatus of claim 17 wherein one or more of the anchoring means comprise copper.

35. The apparatus of claim 17 wherein one or more of the anchoring means comprise titanium copper.

36. The apparatus of claim 17 wherein one or more of the anchoring means comprise nickel.

37. The apparatus of claim 17 wherein the one or more anchoring means overlying the source contact protection means also overlie the first insulating means.

38. The apparatus of claim 17 wherein the gate support means comprise one or more solder bumps.

* * * * *